United States Patent
Tsumita et al.

(10) Patent No.: US 11,624,790 B2
(45) Date of Patent: *Apr. 11, 2023

(54) SPIN ELEMENT AND MAGNETIC MEMORY

(71) Applicant: TDK CORPORATION, Tokyo (JP)

(72) Inventors: Atsushi Tsumita, Tokyo (JP);
Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/668,742

(22) Filed: Feb. 10, 2022

(65) Prior Publication Data

US 2022/0163606 A1    May 26, 2022

Related U.S. Application Data

(62) Division of application No. 16/475,478, filed as application No. PCT/JP2018/047567 on Dec. 25, 2018, now Pat. No. 11,280,854.

(30) Foreign Application Priority Data

Mar. 8, 2018    (JP) .............................. JP2018-042135

(51) Int. Cl.
*G01R 33/09*    (2006.01)
*G11C 11/16*    (2006.01)
*H01L 27/22*    (2006.01)
*H01L 43/04*    (2006.01)
(Continued)

(52) U.S. Cl.
CPC .......... *G01R 33/093* (2013.01); *G11C 11/161* (2013.01); *H01L 27/228* (2013.01);
(Continued)

(58) Field of Classification Search
CPC .............. G01R 33/093; G01R 33/1292; G01R 33/1284; G11C 11/161; G11C 7/04;
(Continued)

(56) References Cited

U.S. PATENT DOCUMENTS

2016/0320460 A1    11/2016 Mather et al.
2017/0331484 A1    11/2017 Kudo
(Continued)

FOREIGN PATENT DOCUMENTS

JP    2012-104689 A    5/2012
JP    2017-204833 A    11/2017
(Continued)

OTHER PUBLICATIONS

S. Fukami et al. "A Spin-Orbit Torque Switching Scheme With Collinear Magnetic Easy Axis and Current Configuration". Nature Nanotechnology, Mar. 21, 2016, pp. 1-6.
(Continued)

*Primary Examiner* — Fernando Hidalgo
(74) *Attorney, Agent, or Firm* — Oliff PLC

(57) ABSTRACT

A spin element includes an element portion including a first ferromagnetic layer, a conducting portion that extends in a first direction as viewed in a lamination direction of the first ferromagnetic layer and faces the first ferromagnetic layer, and a current path extending from the conducting portion to a semiconductor circuit and having a resistance adjusting portion between the conducting portion and the semiconductor circuit, wherein the resistance value of the resistance adjusting portion is higher than the resistance value of the conducting portion, and the temperature coefficient of the volume resistivity of a material forming the resistance adjusting portion is lower than the temperature coefficient of the volume resistivity of a material forming the conducting portion.

10 Claims, 5 Drawing Sheets

(51) Int. Cl.
*H01L 43/08* (2006.01)
*H01L 43/10* (2006.01)

(52) U.S. Cl.
CPC .............. *H01L 43/04* (2013.01); *H01L 43/08* (2013.01); *H01L 43/10* (2013.01)

(58) Field of Classification Search
CPC . G11C 11/1675; G11C 11/1659; G11C 11/18; H01L 27/228; H01L 43/04; H01L 43/08; H01L 43/10; H01L 43/02; H01L 21/8239; H01L 27/105; H01L 29/82
USPC ........................................................ 365/158
See application file for complete search history.

(56) References Cited

U.S. PATENT DOCUMENTS

| | | |
|---|---|---|
| 2018/0123022 A1 | 5/2018 | Sasaki et al. |
| 2018/0123024 A1 | 5/2018 | Sasaki et al. |
| 2018/0337327 A1 | 11/2018 | Tang et al. |
| 2018/0350432 A1 | 12/2018 | Sasaki |
| 2018/0374526 A1 | 12/2018 | Lee et al. |
| 2019/0035449 A1 | 1/2019 | Saida et al. |
| 2019/0147929 A1 | 5/2019 | Sasaki et al. |
| 2019/0206431 A1 | 7/2019 | Sasaki et al. |
| 2022/0158082 A1* | 5/2022 | Sasaki .................... H01L 43/10 |

FOREIGN PATENT DOCUMENTS

| | | |
|---|---|---|
| WO | 2017/183573 A1 | 10/2017 |
| WO | 2017/208880 A1 | 12/2017 |

OTHER PUBLICATIONS

Translation of Nov. 18, 2022 Office Action issued in Chinese Application 201880006593.9.

* cited by examiner

SPIN ELEMENT AND MAGNETIC MEMORY

CROSS REFERENCE TO RELATED APPLICATION

This application is a divisional application of U.S. application Ser. No. 16/475,478, filed Jul. 2, 2019, the contents of which are incorporated herein by reference.

BACKGROUND OF THE INVENTION

Field of the Invention

The present invention relates to a spin element and a magnetic memory. Priority is claimed on Japanese Patent Application No. 2018-042135, filed Mar. 8, 2018, the content of which is incorporated herein by reference.

Description of Related Art

A giant magnetoresistance (GMR) element including a multilayer film of ferromagnetic and nonmagnetic layers, and a tunnel magnetoresistance (TMR) element using an insulating layer (a tunnel barrier layer or a barrier layer) as a nonmagnetic layer are known. These are attracting attention as elements for magnetic sensors, high frequency components, magnetic heads, and nonvolatile random access memories (MRAMs).

In the case of an MRAM, data is read from and written to it by utilizing the characteristic that the resistance of a GMR element or a TMR element changes as the magnetization direction of two ferromagnetic layers sandwiching an insulating layer therebetween changes. Known writing schemes of an MRAM include a scheme in which writing (magnetization reversal) is performed using a magnetic field generated by a current and a scheme in which writing (magnetization reversal) is performed using a spin transfer torque (STT) generated by causing a current to flow in the lamination direction of a magnetoresistive element.

The magnetization reversal of a TMR element using an STT is efficient from the viewpoint of energy efficiency, but the reversal current density for causing the magnetization reversal is high. It is desirable that the reversal current density be low from the viewpoint of a long life of the TMR element. The same applies to a GMR element.

In recent years, therefore, attention has been focused on magnetization reversal using a spin orbit torque (SOT) as a means for reducing the reversal current with a mechanism different from an STT. For example, Non-Patent Document 1 describes an SOT type magnetoresistive element using an SOT. An SOT is induced by a pure spin current generated by the spin Hall effect or an interfacial Rashba effect at the interface of different materials. A current for inducing an SOT in a magnetoresistive element is caused to flow in a direction intersecting the lamination direction of the magnetoresistive element. Thus, in an SOT-MRAM, it is unnecessary to cause a current to flow through the tunnel barrier layer of the TMR element and it is expected that the life of a magnetoresistive element will be able to be extended.

In addition, a spin that contributes to magnetization reversal is introduced through the junction surface between a TMR element and an SOT wiring layer. Whether or not the magnetization is reversed in the ferromagnetic material of the TMR element is determined by the current density of a current flowing through the SOT wiring. A current density required to reverse the magnetization of the ferromagnetic material is called a critical current density.

Patent Documents

[Non-Patent Document 1] S. Fukami, T. Anekawa, C. Zhang and H. Ohno, Nature Nano Tech (2016). DOI: 10.1038/NNANO. 2016.29

SUMMARY OF THE INVENTION

Here, the resistance value of the SOT wiring fluctuates depending on temperature. When the resistance value fluctuates, the current density of a current flowing through the SOT wiring fluctuates with the same voltage being applied. The fluctuation of the current density of a current flowing through the SOT wiring causes a decrease in write probability or causes back hopping. Further, such phenomena are not limited to an SOT type magnetoresistive element using an SOT, and the same applies to a domain wall motion type magnetic recording element using the movement of a domain wall.

The present invention has been made in view of the above problems and it is an object of the present invention to provide a spin element and a magnetic memory with improved operation stability in ranges of different temperatures.

The present invention provides the following means to solve the above problems.

(1) A spin element according to a first aspect includes an element portion including a first ferromagnetic layer, a conducting portion that extends in a first direction as viewed in a lamination direction of the first ferromagnetic layer and faces the first ferromagnetic layer, and a current path extending from the conducting portion to a semiconductor circuit and having a resistance adjusting portion in a middle of the current path, wherein a resistance value of the resistance adjusting portion is higher than a resistance value of the conducting portion, and a temperature coefficient of volume resistivity of a material forming the resistance adjusting portion is lower than a temperature coefficient of volume resistivity of a material forming the conducting portion.

(2) In the spin element according to the above aspect, the resistance adjusting portion may include a plurality of resistance adjusting parts that are disposed apart from each other, the plurality of resistance adjusting parts may include a first resistance adjusting portion and a second resistance adjusting portion, the first resistance adjusting portion may be disposed in a current path between a first end of the conducting portion in the first direction and a first semiconductor circuit, and the second resistance adjusting portion may be disposed in a current path between a second end of the conducting portion in the first direction and a second semiconductor circuit.

(3) In the spin element according to the above aspect, the resistance adjusting portion may include a plurality of resistance adjusting parts that are disposed apart from each other, the resistance adjusting portion may be within a range of an outer shape of the conducting portion in a plan view in the lamination direction, and at least one of the plurality of resistance adjusting parts may extend in the first direction.

(4) In the spin element according to the above aspect, the resistance adjusting portion may include a plurality of resistance adjusting parts that are disposed apart from each other, at least one of the plurality of resistance adjusting parts may be disposed outside a range of an outer shape of the conducting portion in a plan view in the lamination direction, and the resistance adjusting part disposed outside the range of the outer shape may extend in an in-plane direction orthogonal to the lamination direction.

(5) In the spin element according to the above aspect, the plurality of resistance adjusting parts may all extend in the first direction, and at least a part of the plurality of resistance adjusting parts may be disposed at a depth position different from that of the conducting portion.

(6) In the spin element according to the above aspect, the resistance adjusting portion is made of a material selected from the group consisting of Ni—Cr, platinum rhodium, Chromel, Incoloy and stainless steel.

(7) In the spin element according to the above aspect, the conducting portion may be a spin-orbit torque wiring configured to apply a spin orbit torque to a magnetization of the first ferromagnetic layer to rotate the magnetization of the first ferromagnetic layer, and the element portion may consist of the first ferromagnetic layer.

(8) In the spin element according to the above aspect, the conducting portion may be a spin-orbit torque wiring configured to apply a spin orbit torque to a magnetization of the first ferromagnetic layer to rotate the magnetization of the first ferromagnetic layer, and the element portion may have the first ferromagnetic layer, a nonmagnetic layer, and a second ferromagnetic layer in order of increasing distance from the conducting portion.

(9) In the spin element according to the above aspect, the conducting portion may be a magnetic recording layer having a domain wall, and the element portion may have a nonmagnetic layer and the first ferromagnetic layer in order of increasing distance from the magnetic recording layer.

(10) A magnetic memory according to a second aspect includes a plurality of spin elements according to the first aspect.

According to the spin element of the present invention, stable operation can be performed even in ranges of different temperatures.

DETAILED DESCRIPTION OF THE INVENTION

Figure 1:
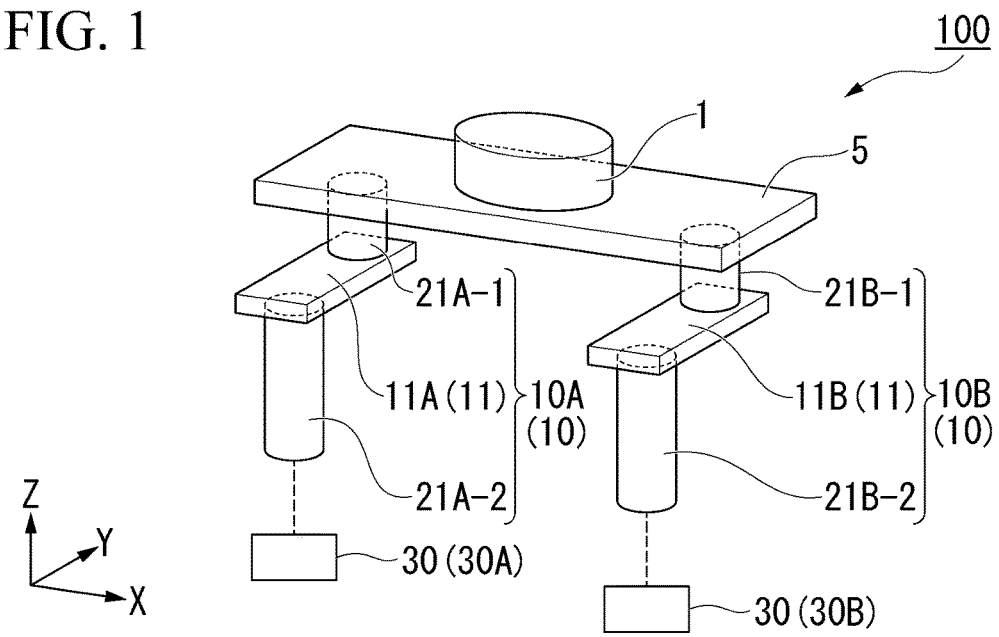
FIG. 1 is a perspective view schematically showing a spin-orbit-torque (SOT) type magnetization rotational element according to a first embodiment.

Hereinafter, the embodiments will be described in detail with reference to the drawings as appropriate. In the drawings used in the following description, to make features of the present invention easy to understand, some portions corresponding to the features are shown enlarged for the sake of convenience and the dimensional proportions or the like between components may be different from those of the actual ones. Materials, dimensions, or the like provided in the following description are merely exemplary examples and the present invention is not limited thereto and can be carried out by appropriately changing them within a range in which the effects of the present invention are exhibited.

(Spin-Orbit-Torque (SOT) Type Magnetization Rotational Element)

[First embodiment]

FIG. 1 is a perspective view schematically showing an SOT type magnetization rotational element 100 according to a first embodiment of the present invention. The SOT type magnetization rotational element is an example of the spin element.

The SOT type magnetization rotational element 100 has a first ferromagnetic layer 1, an SOT wiring 5, and a current path 10 (10A, 10B). The SOT wiring 5 is an example of the conducting portion. The first ferromagnetic layer 1 is an example of the element portion. In FIG. 1, a semiconductor circuit 30 connected to the SOT type magnetization rotational element 100 is also shown. The SOT wiring 5 extends in a first direction (X direction) as viewed in the direction of lamination of the first ferromagnetic layer 1 (Z direction). That is, the SOT wiring 5 has a long axis in the X direction in a plan view in the Z direction. The SOT wiring 5 faces the first ferromagnetic layer 1. Here, facing refers to a facing relationship in which the two layers may be in contact with each other or may have another layer therebetween. The current path 10 (10A, 10B) electrically connects the SOT wiring 5 and the semiconductor circuit 30 (a first semiconductor circuit 30A and a second semiconductor circuit 30B).

The current path 10 (10A, 10B) includes a resistance adjusting portion 11 (a first resistance adjusting portion 11A and a second resistance adjusting portion 11B) between the SOT wiring 5 and the semiconductor circuit 30. The resistance value of the resistance adjusting portion 11 is higher than the resistance value of the SOT wiring 5. The temperature coefficient of the volume resistivity of a material forming the resistance adjusting portion 11 is lower than the temperature coefficient of the volume resistivity of a material forming the SOT wiring 5.

Figure 2:
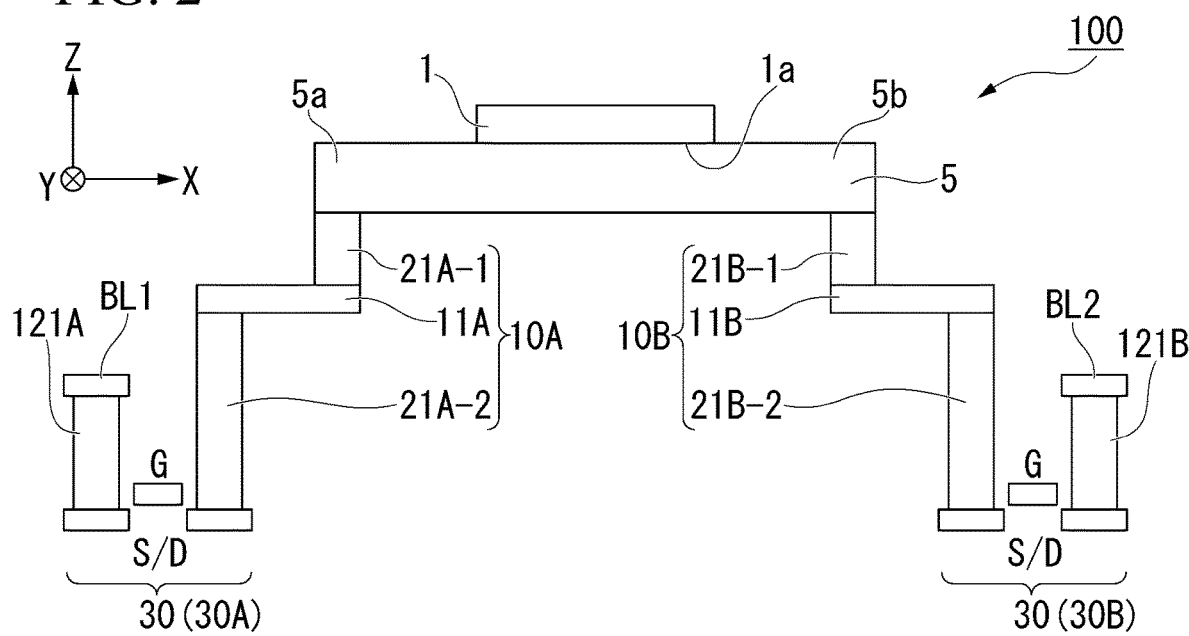
FIG. 2 is a schematic cross-sectional view of a configuration including the SOT type magnetization rotational element shown in FIG. 1.

The semiconductor circuit 30 is a circuit provided to cause a current to flow in the SOT wiring 5 and is, for example, a transistor (see FIG. 2). The semiconductor circuit 30 is external to the SOT type magnetization rotational element 100.

FIG. 2 is a cross-sectional view of the SOT type magnetization rotational element 100 shown in FIG. 1 to which an example of the semiconductor circuit 30 is added. The semiconductor circuit 30 shown in FIG. 2 includes a transistor 30A (with a source and drain S/D and a gate electrode G), a transistor 30B (with a source and drain S/D and a gate electrode G), vias 121A and 121B connected thereto, and bit lines BL1 and BL2.

When the transistors 30A and 30B are turned on to apply a predetermined potential difference between the bit lines BL1 and BL2, a current flows between the bit line BL1 and the bit line BL2. For example, a current flows through the bit line BL1, the via 121A, the transistor 30A, the via 21A-2, the first resistance adjusting portion 11A, and the via 21A-1 in this order and is then supplied to a first end 5a of the SOT wiring 5. In contrast, a current may also flow though the bit line BL2, the via 121B, the transistor 30B, the via 21B-2, the second resistance adjusting portion 11B, and the via 21B-1 in this order and be then supplied to a second end 5b of the SOT wiring 5.

When a current flows in the SOT wiring 5, a pure spin current is generated in the SOT wiring 5. The pure spin current supplies spins to the first ferromagnetic layer 1 via a junction surface 1a between the first ferromagnetic layer 1 and the SOT wiring 5. The supplied spins give a spin orbit torque (SOT) to the magnetization of the first ferromagnetic layer 1.

In this specification, the "current path" refers to a path through which current flows. A typical example of the "current path" in this specification is a via or a wiring. On the other hand, the "current path" in this specification does not include a current path resulting from a parasitic capacitance or a parasitic inductance and a current path of a minute current flowing in an insulator. A via is a connection region that electrically connects lower and upper layer wirings in multilayer wirings. A via is formed by etching an interlayer insulating film to open a via hole and filling the via hole with a metal material. In this specification, a via and a wiring may be collectively referred to as a via wiring. The "current path" in this specification includes a current path having a via wiring and a resistance adjusting portion and a current path that having a via wiring, a resistance adjusting portion and other components.

In this specification, a "semiconductor circuit external to the element" refers to a semiconductor circuit that is first reached when a current path connected to the SOT wiring (the conducting portion) is followed from the SOT wiring. In other words, the "semiconductor circuit" in this specification refers to a semiconductor circuit closest to the SOT wiring on the current path. Accordingly, in the example shown in FIG. 1, the current paths 10A and 10B between the SOT wiring 5 and the semiconductor circuit 30 are the current path of the via 21A-1, the first resistance adjusting portion 11A, and the via 21A-2 which are disposed between the SOT wiring 5 and the transistor 30A, and the current path of the via 21B-1, the second resistance adjusting portion 11B, and the via 21B-2 which are disposed between the SOT wiring 5 and the transistor 30B, respectively. Thus, the via 121A and the via 121B are not included in the "current paths between the SOT wiring and the semiconductor circuit."

<First Ferromagnetic Layer>

The first ferromagnetic layer 1 includes a ferromagnetic material. For example, a metal selected from the group consisting of Cr, Mn, Co, Fe and Ni, an alloy containing at least one of these metals, or an alloy containing these metals and at least one element of B, C, and N can be used as a ferromagnetic material forming the first ferromagnetic layer 1. Specific examples of the ferromagnetic material are Co—Fe, Co—Fe—B, and Ni—Fe.

The material forming the first ferromagnetic layer 1 may also be a Heusler alloy. The Heusler alloy is a half-metal and has high spin polarization. The Heusler alloy is an intermetallic compound having a chemical composition of XYZ or $X_2YZ$. X is a transition metal element or a noble metal element of Co, Fe, Ni or Cu groups in the periodic table. Y is a transition metal element of Mn, V, Cr or Ti groups or the same element as X. Z is a typical element of Groups III to V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, and $Co_2FeGe_{1-c}Ga_c$.

The first ferromagnetic layer 1 may be an in-plane magnetization film having an easy magnetization axis in the in-plane direction of XY or a perpendicular magnetization film having an easy magnetization axis in the Z direction. The magnetization easy axis may also be inclined with respect to the Z direction.

The film thickness of the first ferromagnetic layer 1 is preferably 2.5 nm or less, more preferably 2.0 nm or less, when the magnetization easy axis of the first ferromagnetic layer 1 is in the Z direction (such that it is a perpendicular magnetization film). To secure a sufficient amount of magnetization, the film thickness of the first ferromagnetic layer 1 is preferably 1.0 nm or more. When the film thickness of the first ferromagnetic layer 1 is reduced, the first ferromagnetic layer 1 has perpendicular magnetic anisotropy (interface perpendicular magnetic anisotropy) under the influence of the interface between the first ferromagnetic layer 1 and the other layers.

<SOT Wiring>

The SOT wiring 5 extends in the X direction. The SOT wiring 5 faces one surface of the first ferromagnetic layer 1 in the Z direction. The SOT wiring 5 may be directly connected to the first ferromagnetic layer 1 or may be connected thereto via another layer.

When a layer is interposed between the SOT wiring 5 and the first ferromagnetic layer 1, the layer interposed between the SOT wiring 5 and the first ferromagnetic layer 1 is preferably made of a material that does not easily dissipate spins propagating from the SOT wiring 5. For example, it is known that silver, copper, magnesium, and aluminum have a long spin diffusion length of 100 nm or more and do not easily dissipate spins.

The thickness of this layer is preferably equal to or less than the spin diffusion length of the material forming the layer. If the thickness of the layer is equal to or less than the spin diffusion length, spins propagating from the SOT wiring 5 can be sufficiently transferred to the first ferromagnetic layer 1.

The SOT wiring 5 is made of a material in which a spin current is generated by the spin Hall effect when a current flows. A material configured to generate a spin current in the SOT wiring 5 is sufficient as such a material. Accordingly, this material is not limited to a material composed of a single element and may include a part made of a material in which a spin current is generated and a part made of a material in which a spin current is hardly generated.

The spin Hall effect is a phenomenon in which when a current flows in a wiring, a spin current is induced in a direction orthogonal to the direction of the current on the basis of the spin-orbit interaction. When a current flows in the wiring, a first spin oriented in one direction and a second spin oriented in the opposite direction to the first spin are bent in the direction orthogonal to the current. A spin current is induced in a direction of eliminating the uneven distribution of the first and second spins. The ordinary Hall effect and the spin Hall effect are the same in that moving (traveling) charges (electrons) are bent in the moving (traveling) direction. On the other hand, in the ordinary Hall effect, charged particles moving in a magnetic field are bent in the moving direction under a Lorentz force, whereas in the spin Hall effect, electrons are bent in the moving direction only due to their movement (current flowing) even in the absence of a magnetic field, which is a great difference from the ordinary Hall effect.

In a nonmagnetic material (nonferromagnetic material), the number of electrons of the first spin and the number of electrons of the second spin are equal. Therefore, the number of electrons of the first spin toward a first surface of the SOT wiring 5 on which the first ferromagnetic layer 1 is disposed and the number of electrons of the second spin S2 toward the opposite direction to the first surface are equal. In this case, the flows of charge cancel each other out and the amount of current becomes zero. A spin current without this current is particularly called a pure spin current.

When the flow of electrons of the first spin, the flow of electrons of the second spin, and the spin current are denoted by $J_\uparrow$, $J_\downarrow$, and $J_S$, respectively, the spin current is defined such that $J_S=J_\uparrow-J_\downarrow$. $J_S$ flows in one direction as a pure spin current. Here, $J_S$ is a flow of electrons with a polarizability of 100%.

The main component of the SOT wiring 5 is preferably a nonmagnetic heavy metal. Here, the term "heavy metal" is used to indicate a metal having a specific gravity equal to or higher than that of yttrium. The SOT wiring 5 may be made of only a nonmagnetic heavy metal.

It is preferable that the nonmagnetic heavy metal be a nonmagnetic metal having a high atomic number of 39 or more and having d or f electrons in the outermost shell. Nonmagnetic heavy metals have a great spin-orbit interaction that causes the spin Hall effect. The SOT wiring 5 may be made of only a nonmagnetic metal having a high atomic number of 39 or more and having d or f electrons in the outermost shell.

Normally, electrons move in a direction opposite to the direction of the current regardless of the directions of spins. However, a nonmagnetic metal having a high atomic number and having d or f electrons in the outermost shell has a great spin-orbit interaction, such that the spin Hall effect acts strongly. Therefore, the direction of movement of electrons depends on the directions of spins of electrons. Thus, a spin current $J_S$ is easily generated in such nonmagnetic heavy metals.

The SOT wiring 5 may also contain a magnetic metal. "Magnetic metal" indicates a ferromagnetic metal or an antiferromagnetic metal. When the antiferromagnetic metal contains a small amount of magnetic metal, it becomes a spin scattering factor. When spins are scattered, the spin-orbit interaction is enhanced and the efficiency of spin current generation of a current flowing through the SOT wiring 5 is increased. The SOT wiring 5 may also be made of only an antiferromagnetic metal.

Since the spin-orbit interaction is caused by an intrinsic internal field of the material of the SOT wiring, a pure spin current is also generated in a nonmagnetic material. If a trace amount of a magnetic metal is added to the SOT wiring, the magnetic metal scatters electrons (spins) flowing through the material. As a result, the efficiency of spin current generation of the SOT wiring 5 is improved. However, if the amount of the magnetic metal added is excessively increased, the added magnetic metal scatters the generated spin current, which may result in increasing the effect of decreasing the spin current. Therefore, it is preferable that the mole fraction of the added magnetic metal be sufficiently smaller than the mole fraction of the main element of the spin generating portion in the SOT wiring. It is preferable that the mole fraction of the added magnetic metal be roughly 3% or less.

The SOT wiring 5 may also include a topological insulator. The SOT wiring 5 may be made of only a topological insulator. The topological insulator is a material which is internally an insulator or a high resistance body but causes a spin-polarized metallic state on the surface thereof. In this material, an internal magnetic field is generated by the spin-orbit interaction. Therefore, even if there is no external magnetic field, a new topological phase arises in the material due to the effect of the spin-orbit interaction. This is a topological insulator which can generate a pure spin current with high efficiency due to a strong spin-orbit interaction and breaking of reversal symmetry at the edge.

The topological insulator is preferably, for example, SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, or the like. These topological insulators are capable of generating a spin current with high efficiency.

<Resistance Adjusting Portion>

The resistance adjusting portion 11 is located in the middle of the current path 10 between the SOT wiring and the semiconductor circuit. In other words, the resistance adjusting portion 11 constitutes the current path 10 as a part of the current path 10 between the SOT wiring 5 and the semiconductor circuit 30.

The resistance adjusting portion 11 may be formed of one part. For example, in FIGS. 1 and 2, the resistance adjusting portion 11 may include only the first resistance adjusting portion 11A or only the second resistance adjusting portion 11B. The resistance adjusting portion 11 may also be formed of a plurality of resistance adjusting parts that are disposed apart from each other. For example, as shown in FIGS. 1 and 2, the plurality of resistance adjusting parts may have the first resistance adjusting portion 11A and the second resistance adjusting portion 11B. When the resistance adjusting portion 11 includes a plurality of resistance adjusting parts, adjacent resistance adjusting parts are connected together through a via wiring.

The resistance adjusting portion 11 is formed of two resistance adjusting parts that are disposed apart from each other in the example shown in FIGS. 1 and 2, but may also be formed of three or more resistance adjusting parts.

When the resistance adjustment portion is formed of a plurality of resistance adjusting parts that are disposed apart from each other, the degree of freedom in design of the entire resistance value of the resistance adjustment portion is increased. On the other hand, when the resistance adjusting portion is formed of one part, the fabrication is easy.

In the example shown in FIGS. 1 and 2, the resistance adjusting portion 11 (the first resistance adjusting portion 11A and the second resistance adjusting portion 11B) is connected to the SOT wiring 5 through vias. The resistance adjusting portion 11 is not limited to this case and may be directly connected to the SOT wiring 5 without vias.

Further, in the example shown in FIGS. 1 and 2, the first resistance adjusting portion 11A and the second resistance adjusting portion 11B are electrically connected to the first end 5a and the second end 5b that are ends in the X direction which is the longitudinal direction of the SOT wiring 5 through the via 21A-1 and the via 21B-1, respectively. The first resistance adjusting portion 11A and the second resistance adjusting portion 11B may also be connected directly or indirectly to portions other than the first end 5a and the second end 5b.

Moreover, in the example shown in FIG. 1 and FIG. 2, the resistance adjusting portion 11 (the first resistance adjusting portion 11A and the second resistance adjusting portion 11B) is that with which a member corresponding to a wiring in a normal via wiring is substituted. However, the resistance adjusting portion 11 may also be that with which a member corresponding to a via or a member other than a via wiring which constitutes a current path is substituted.

The resistance adjusting portion 11 has a resistance value higher than that of the SOT wiring 5.

Here, the resistance value is represented by equation R=ρL/A (where R is the resistance value, ρ is the resistivity, L is the length, and A is the cross-sectional area). The resistance value can be freely designed by changing at least one or two of the resistivity (volume resistivity), the length, and the cross-sectional area.

Further, the temperature coefficient of the volume resistivity of the material forming the resistance adjusting portion 11 is lower than the temperature coefficient of the volume resistivity of the material forming the SOT wiring 5.

Here, the "temperature coefficient of the volume resistivity" in this specification is calculated as $\alpha_{0,100}=\{(\rho_{100}-\rho_0)/\rho_0\}\times 100$ when the volume resistivity at 0° C. is $\rho_0$ and that at 100° C. is $\rho_{100}$.

The SOT type magnetization rotational element 100 can stably supply an appropriate value of current to the SOT wiring by including the resistance adjusting portion 11. As a result, it is possible to prevent a decrease in write probability due to a decrease in write current or back hopping due to an increase in current.

For example, a material selected from the group consisting of Ni—Cr, platinum rhodium, Chromel, Incoloy, and stainless steel can be used as the material of the resistance adjusting portion 11.

These materials have a low rate of change of the volume resistivity at 100° C. with respect to the volume resistivity at 0° C. (the temperature coefficient as defined above), which is 15% or less for all of them, 10% or less for materials other than platinum rhodium, and 4% or less for Ni—Cr, Chromel and Incoloy.

[Second embodiment]

Figure 3:
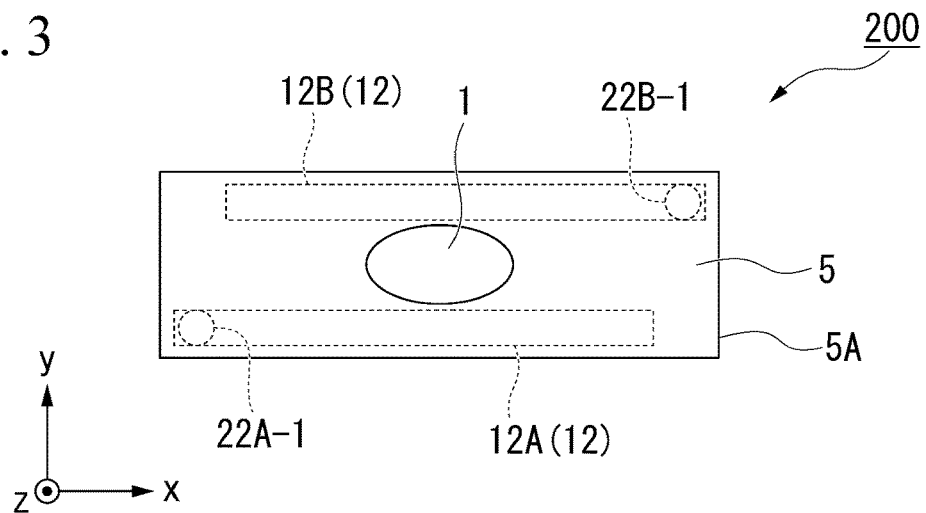
FIG. 3 is a schematic plan view of an SOT type magnetization rotational element according to a second embodiment.

FIG. 3 is a schematic plan view of an SOT type magnetization rotational element 200 according to a second embodiment of the present invention as viewed in the Z direction.

Hereinafter, features of the SOT type magnetization rotational element 200 according to the second embodiment will be described. The same reference signs are assigned to components common with the SOT type magnetization rotational element 100 according to the first embodiment and a description thereof will be omitted.

In the SOT type magnetization rotational element 200, a resistance adjusting portion 12 is formed of two resistance adjusting parts 12A and 12B that are disposed apart from each other. The resistance adjusting portion 12 is within the range of an outer shape 5A of an SOT wiring 5 in a plan view in the Z direction. The two resistance adjusting parts 12A and 12B extend in the same X direction as the direction in which the SOT wiring 5 extends.

When the resistance adjusting portion 12 is within the range of the outer shape 5A of the SOT wiring 5, the SOT type magnetization rotational elements can be densely arranged and thus the degree of integration of the entire element is increased. Further, the resistance of the resistance adjusting portion 12 can be increased since the resistance adjusting portion 12 extends long in the extending direction of the SOT wiring 5 (X direction).

In the SOT type magnetization rotational element 200 shown in FIG. 3, both the two resistance adjusting parts 12A and 12B constituting the resistance adjusting portion 12 extend in the same X direction as the extending direction of the SOT wiring 5. However, only one of the two resistance adjusting parts 12A and 12B may extend in the X direction. Even in this case, the resistance of the one resistance adjusting part can be increased.

Figure 4A:
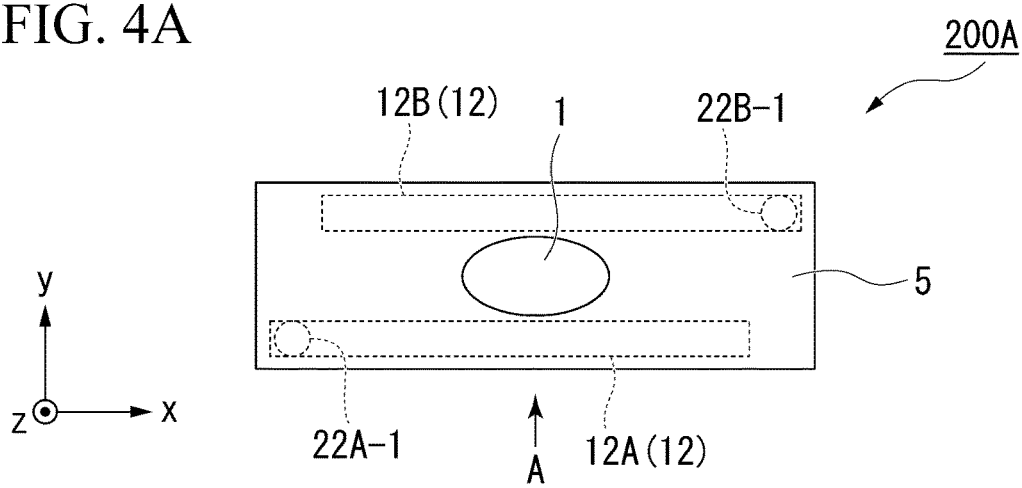
FIG. 4A is a schematic plan view of an SOT type magnetization rotational element according to a modification of the second embodiment.
Figure 4B:
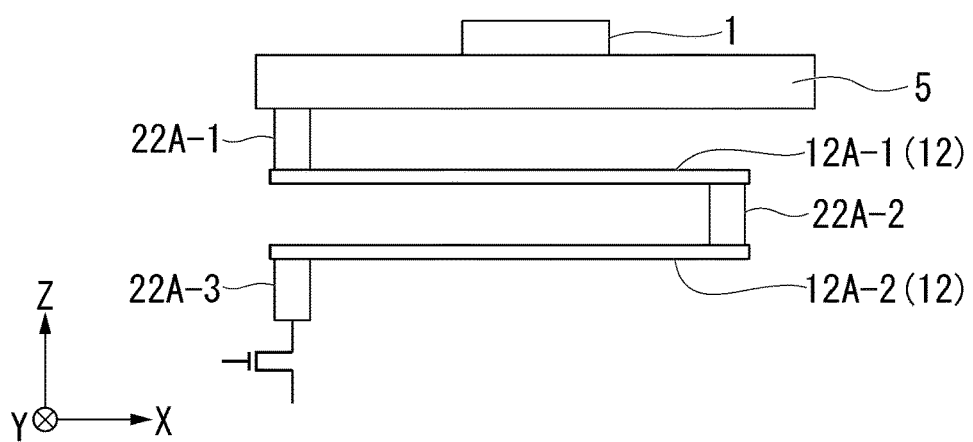
FIG. 4B is a schematic side view of an SOT type magnetization rotational element as viewed in the direction of arrow A in FIG. 4A.

FIG. 4A is a schematic plan view of an SOT type magnetization rotational element 200A according to a modification of the second embodiment. FIG. 4B is a schematic side view of FIG. 4A as viewed in the direction of arrow A.

The SOT type magnetization rotational element 200A of this modification differs from the configuration shown in FIG. 3 in that a plurality of resistance adjusting parts extending in the same X direction as the extending direction of the SOT wiring are provided at different depth positions.

Specifically, the resistance adjusting part 12A has two resistance adjusting parts. These resistance adjusting parts 12A-1 and 12A-2 are located at different depth positions. Similarly, the resistance adjusting part 12B has two resistance adjusting parts. These two resistance adjusting parts are located at positions overlapping the resistance adjusting parts 12A-1 and 12A-2 in FIG. 4B. That is, the resistance adjusting portion 12 includes four resistance adjusting parts.

Resistance adjusting parts that are adjacent in the depth direction (for example, the resistance adjusting parts 12A-1 and 12A-2) are connected together through a via.

The number of resistance adjusting parts is four in the example shown in FIGS. 4A and 4B, but may be three or may be five or more. Resistance adjusting parts need not be arranged symmetrically. Resistance adjusting parts may be disposed at different depth positions of three or more layers. When each depth is counted as one layer, the resistance adjusting parts are in one layer in the example shown in FIG. 3 and are in two layers in the example shown in FIG. 4.

By providing resistance adjusting parts constituting the resistance adjusting portion at two or more depths (that is, in two or more layers), the length of the resistance is made longer as compared with the configuration in which they are provided only in one layer. That is, the entire resistance value of the resistance adjusting portion can be increased.

The configuration in which resistance adjusting parts constituting the resistance adjusting portion are provided at different depths (in different layers) may also be applied to other embodiments.

[Third embodiment]

Figure 5:
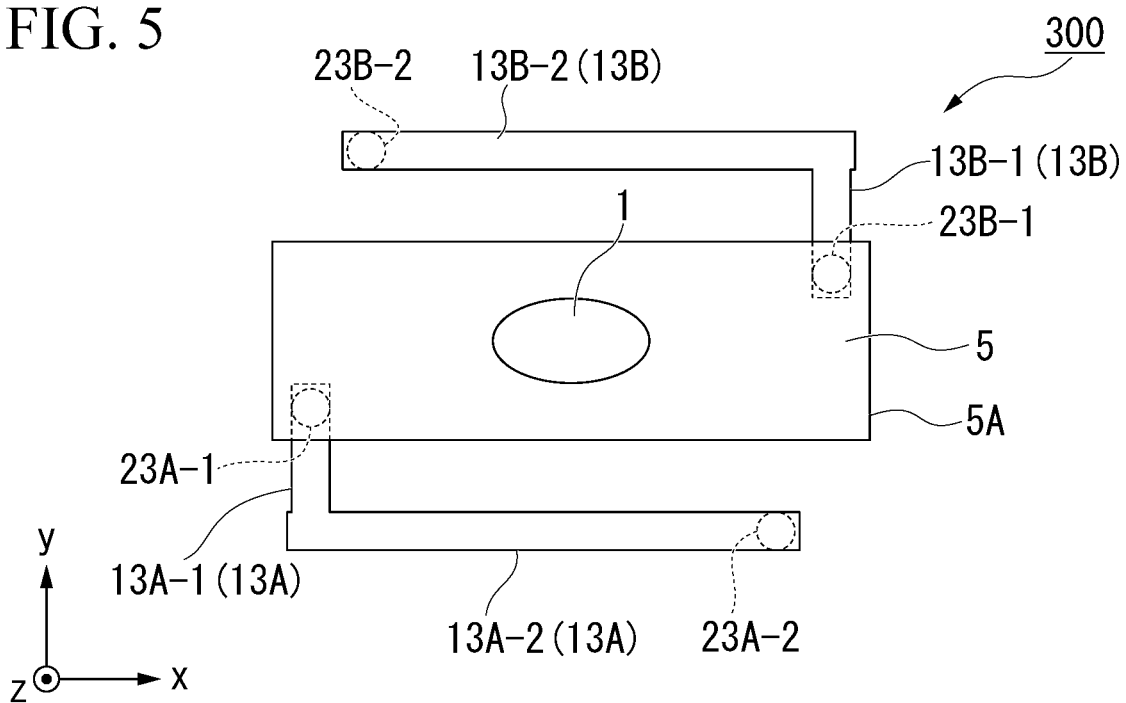
FIG. 5 is a schematic plan view of an SOT type magnetization rotational element according to a third embodiment.

FIG. 5 is a schematic plan view of an SOT type magnetization rotational element 300 according to a third embodiment as viewed in the Z direction.

Hereinafter, features of the SOT type magnetization rotational element 300 according to the third embodiment will be described. The same reference signs are assigned to components common with the SOT type magnetization rotational element 100 according to the first embodiment and the SOT type magnetization rotational elements 200 and 200A according to the second embodiment and a description thereof will be omitted.

In the SOT type magnetization rotational element 300, a resistance adjusting portion 13 includes two resistance adjusting parts 13A and 13B that are disposed apart from each other. At least a part of the resistance adjusting parts 13A and 13B is disposed outside the range of an outer shape 5A of an SOT wiring 5 in a plan view in the lamination direction (Z direction). The two resistance adjusting parts 13A and 13B extend in an in-plane direction (in the in-plane direction of XY) orthogonal to the lamination direction (Z direction).

Here, the disposition of resistance adjusting parts constituting the resistance adjusting portion outside the range of the outer shape 5A of the SOT wiring 5 in a plan view in the lamination direction (Z direction) means disposition of least a part of the resistance adjusting parts outside the range of the outer shape of the SOT wiring. For example, the resistance adjusting part 13A shown in FIG. 5 includes a first part 13A-1 and a second part 13A-2. The first part 13A-1 is a portion that is connected to a via 23A-1 and extends in the Y direction. The second part 13A-2 is a portion that extends in the X direction from an end of the first part 13A-1 which is not connected to the via 23A-1. The second part 13A-2 is disposed outside the range of the outer shape of the SOT wiring. One portion (a solid line portion) of the first part 13A-1 is disposed outside the range of the outer shape, while another portion (a dotted line portion) thereof is disposed within the range of the outer shape. Similarly, the resistance adjusting part 13B is formed of a first part 13B-1 and a second part 13B-2. The first part 13B-1 is a portion that is connected to a via 23B-1 and extends in the Y direction. The second part 13B-2 is a portion that extends in the X direction from an end of the first part 13B-1 which is not connected to the via 23B-1. The second part 13B-2 is disposed outside the range of the outer shape of the SOT wiring. One portion (a solid line portion) of the first part 13B-1 is disposed outside the range of the outer shape, while another portion (a dotted line portion) thereof is disposed within the range of the outer shape.

When the resistance adjusting parts 13A and 13B constituting the resistance adjusting portion are arranged outside the range of the outer shape 5A of the SOT wiring 5 in a plan view in the lamination direction (Z direction), the lengths thereof are increased by the portions (the first part 13A-1 and the second part 13B-2 in the example of FIG. 5) which protrude outside the range of the outer shape 5A from the vias disposed directly below the SOT wiring 5, as compared with the configuration in which they are arranged inside the range of the outer shape 5A. That is, the entire resistance value of the resistance adjusting portion can be increased.

Also in the SOT type magnetization rotational element according to the third embodiment, a plurality of resistance adjusting parts constituting the resistance adjusting portion may be provided at different depths (in different layers).

[Fourth embodiment]
(SOT Type Magnetoresistive Element)

Figure 6:
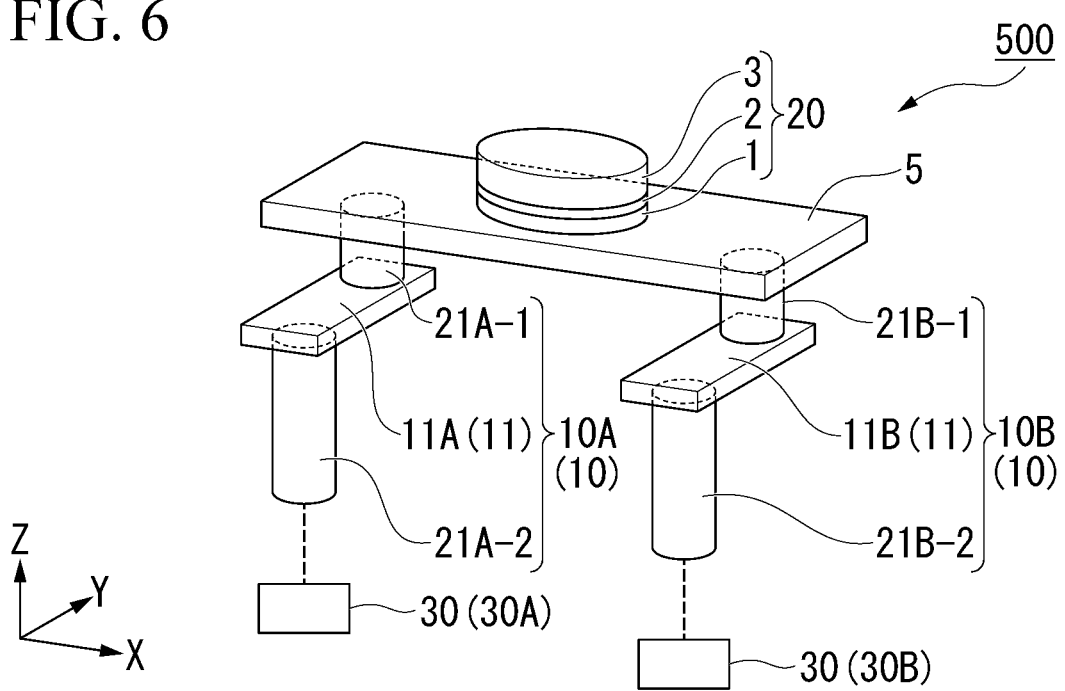
FIG. 6 is a perspective view schematically showing an SOT type magnetoresistive element according to a fourth embodiment.

FIG. 6 is a perspective view schematically showing an SOT type magnetoresistive element 500 according to a fourth embodiment.

The SOT type magnetoresistive element 500 has a first ferromagnetic layer 1, a nonmagnetic layer 2, a second ferromagnetic layer 3, an SOT wiring 5, and a current path 10 (10A and 10B). The SOT wiring 5 is an example of the conducting portion. A structure 20 which is a combination of the first ferromagnetic layer 1, the nonmagnetic layer 2, and the second ferromagnetic layer 3 is an example of the element portion. In FIG. 6, a semiconductor circuit 30 connected to the SOT type magnetoresistive element 500 is also shown. The SOT wiring 5 extends in the first direction (X direction) as viewed in the direction of lamination of the first ferromagnetic layer 1 (Z direction). The SOT wiring 5 faces the first ferromagnetic layer 1. The nonmagnetic layer 2 faces a surface of the first ferromagnetic layer 1 opposite to the SOT wiring 5. The second ferromagnetic layer 3 faces a surface of the nonmagnetic layer 2 opposite to the first ferromagnetic layer 1. The current path 10 (10A, 10B) electrically connects the SOT wiring 5 and the semiconductor circuit 30 (a first semiconductor circuit 30A and a second semiconductor circuit 30B). The current path 10 (10A, 10B) includes a resistance adjusting portion 11 (a first resistance adjusting portion 11A and a second resistance adjusting portion 11B) between the SOT wiring 5 and the semiconductor circuit 30. The resistance value of the resistance adjusting portion 11 is higher than the resistance value of the SOT wiring 5. The temperature coefficient of the volume resistivity of a material forming the resistance adjusting portion 11 is lower than the temperature coefficient of the volume resistivity of a material forming the SOT wiring 5.

The structure 20 which is a combination of the first ferromagnetic layer 1, the nonmagnetic layer 2 and the second ferromagnetic layer 3 is the structure of a normal magnetoresistive element, and thus a layer structure included in a normal magnetoresistive element can be applied to the structure 20.

<Second ferromagnetic layer>

The SOT type magnetoresistive element 500 functions by the magnetization of the second ferromagnetic layer 3 being fixed in one direction and the direction of the magnetization of the first ferromagnetic layer 1 being relatively changed. In the case of application to a coercivity difference type (pseudo spin valve type) MRAM, the coercivity of the second ferromagnetic layer 3 is made greater than the coercivity of the first ferromagnetic layer 1. In the case of application to an exchange bias type (spin valve type) MRAM, the magnetization direction of the second ferromagnetic layer 3 is fixed by exchange coupling with the antiferromagnetic layer.

The SOT type magnetoresistive element 500 is a tunneling magnetoresistance (TMR) element when the nonmagnetic layer 2 is made of an insulator and a giant magnetoresistance (GMR) element when the nonmagnetic layer 2 is made of a metal.

The lamination structure of a known magnetoresistive element can be adopted as the lamination structure of the SOT type magnetoresistive element 500. For example, each layer may be formed of a plurality of layers and another layer such as an antiferromagnetic layer may be provided to fix the magnetization direction of the second ferromagnetic layer 3. The second ferromagnetic layer 3 corresponds to a fixed layer or a reference layer and the first ferromagnetic layer 1 corresponds to a layer that is called a free layer, a storage layer or the like.

A known material can be used as the material of the second ferromagnetic layer 3 and the same material as the first ferromagnetic layer 1 can also be used. Since the first ferromagnetic layer 1 is an in-plane magnetization film, the second ferromagnetic layer 3 is also preferably an in-plane magnetization film.

To increase the coercivity of the second ferromagnetic layer 3 with respect to the first ferromagnetic layer 1, an antiferromagnetic material such as IrMn or PtMn may be used as a material in contact with the second ferromagnetic layer 3. To prevent a leakage magnetic field of the second ferromagnetic layer 3 from affecting the first ferromagnetic layer 1, a synthetic ferromagnetic coupling structure may also be used.

<Nonmagnetic layer>

Known materials can be used for the nonmagnetic layer 2. For example, when the nonmagnetic layer 2 is made of an insulator (i.e., when the nonmagnetic layer 2 is a tunnel barrier layer), $Al_2O_3$, $SiO_2$, $MgO$, $MgAl_2O_4$, or the like can be used as a material for the nonmagnetic layer 2. Besides these materials, a material in which a part of Al, Si, or Mg is substituted with Zn, Be, or the like can also be used for the nonmagnetic layer 2. Among them, $MgO$ and $MgAl_2O_4$ can efficiently inject spins since these are materials capable of realizing coherent tunneling. When the nonmagnetic layer 2 is made of a metal, Cu, Au, Ag, or the like can be used as a material for the nonmagnetic layer 2. Further, when the nonmagnetic layer 2 is made of a semiconductor, Si, Ge, $CuInSe_2$, $CuGaSe_2$, $Cu(In, Ga)Se_2$, or the like can be used as a material for the nonmagnetic layer 2.

[Fifth embodiment]
(Domain Wall Motion Type Magnetoresistive Element)

Figure 7:
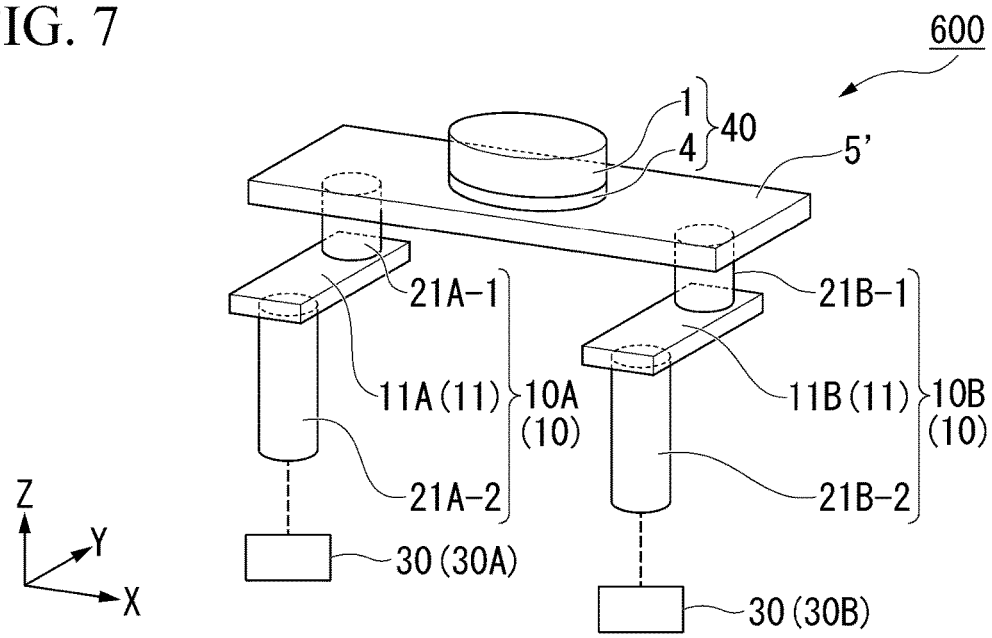
FIG. 7 is a perspective view schematically showing a domain wall motion type magnetic recording element according to a fifth embodiment.
Figure 8:
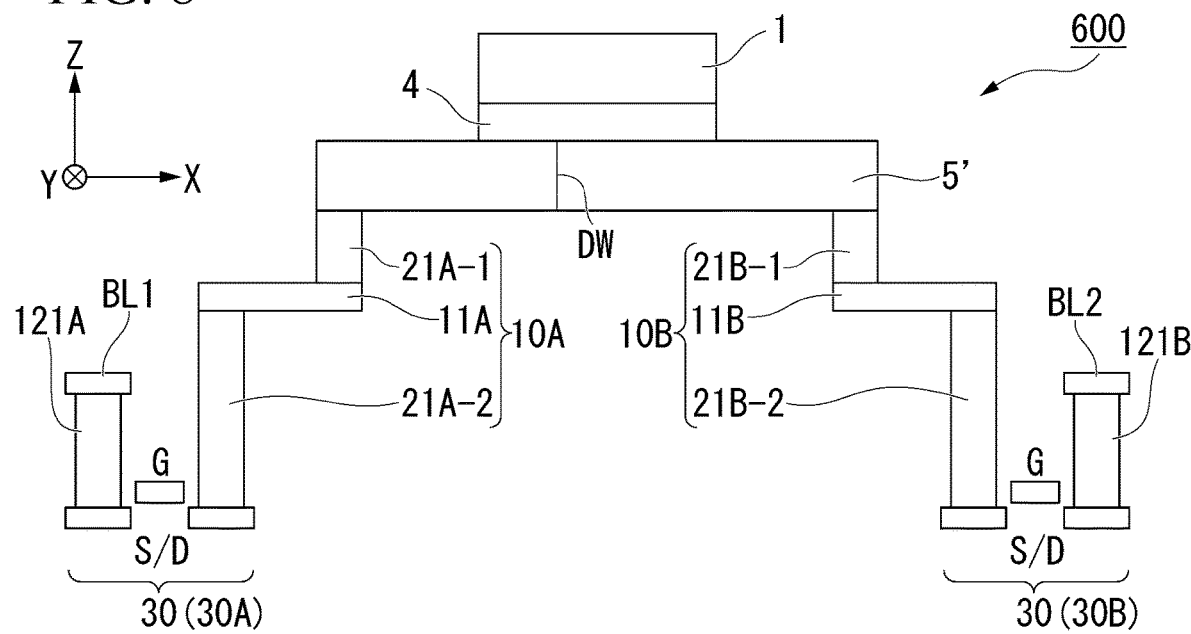
FIG. 8 is a cross-sectional view schematically showing the domain wall motion type magnetic recording element according to the fifth embodiment.

FIG. 7 is a perspective view schematically showing a domain wall motion type magnetic recording element 600 according to a fifth embodiment. FIG. 8 is a cross-sectional view schematically showing the domain wall motion type magnetic recording element 600 according to the fifth embodiment.

The domain wall motion type magnetic recording element 600 has a first ferromagnetic layer 1, a nonmagnetic layer 4, a magnetic recording layer 5', and a current path 10 (10A, 10B). The magnetic recording layer 5' is an example of the conducting portion. A structure 40 which is a combination of the first ferromagnetic layer 1 and the nonmagnetic layer 4 is an example of the element portion. In FIGS. 7 and 8, a semiconductor circuit 30 connected to the domain wall motion type magnetic recording element 600 is also shown. The fifth embodiment is the same as the embodiments described above except that the conducting portion is the magnetic recording layer 5' and the element portion is the structure 40, and a description of the same configuration will be omitted.

The magnetic recording layer 5' extends in the first direction (X direction) as viewed in the direction of lamination of the first ferromagnetic layer 1 (Z direction). The magnetic recording layer 5' faces the first ferromagnetic layer 1. The nonmagnetic layer 4 is located between the first ferromagnetic layer 1 and the magnetic recording layer 5'. The current path 10 (10A, 10B) electrically connects the magnetic recording layer 5' and the semiconductor circuit 30 (a first semiconductor circuit 30A and a second semiconductor circuit 30B). The current path 10 (10A, 10B) includes a resistance adjusting portion 11 (a first resistance adjusting portion 11A and a second resistance adjusting portion 11B) between the magnetic recording layer 5' and the semiconductor circuit 30. The resistance value of the resistance adjusting portion 11 is higher than the resistance value of the magnetic recording layer 5'. The temperature coefficient of the volume resistivity of a material forming the resistance adjusting portion 11 is lower than the temperature coefficient of the volume resistivity of a material forming the magnetic recording layer 5'.

The magnetic recording layer 5' internally has a domain wall DW. A domain wall DW is the boundary between two magnetic domains having magnetizations in opposite directions. The domain wall motion type magnetic recording element 600 records data in multiple values according to the position of the domain wall DW in the magnetic recording layer 5'. The data recorded in the magnetic recording layer 5' is read as a change in the resistance value in the lamination direction of the first ferromagnetic layer 1 and the magnetic recording layer 5'.

The domain wall DW moves when a current flows through the magnetic recording layer 5'. When the position of the domain wall DW changes, the magnetization state of the magnetic recording layer 5' changes. The domain wall motion type magnetic recording element 600 outputs, as data, a change in the resistance value associated with a change in the relative angle of the magnetizations of the two magnetic materials (the first ferromagnetic layer 1 and the magnetic recording layer 5') sandwiching the nonmagnetic layer 4 therebetween.

The magnetic recording layer 5' includes a magnetic material. The same magnetic material as that of the first ferromagnetic layer 1 can be used as the magnetic material forming the magnetic recording layer 5'. The magnetic recording layer 5' preferably contains at least one element selected from the group consisting of Co, Ni, Pt, Pd, Gd, Tb, Mn, Ge, and Ga. Examples of this are a laminated film of Co and Ni, a laminated film of Co and Pt, a laminated film of Co and Pd, a MnGa based material, a GdCo based material, and a TbCo based material. Ferrimagnetic materials such as the MnGa based material, the GdCo based material, and the TbCo based material have small saturation magnetization and can lower a threshold current necessary to move the domain wall DW. The laminated film of Co and Ni, the laminated film of Co and Pt, and the laminated film of Co and Pd have great coercivity and can suppress the moving speed of the domain wall DW.

The SOT type magnetization rotational element, the SOT type magnetoresistive element, and the domain wall motion type magnetic recording element have so far been provided as specific exemplary examples of the spin element. These are the same in that a write current flows in the conducting portion (the SOT wiring 5 and the magnetic recording layer 5') extending in the direction intersecting the first ferromagnetic layer 1 at the time of data writing. The spin element is not limited to these elements as long as a write current flows in the conducting portion extending in the direction intersecting the element portion at the time of data writing.

[Sixth embodiment]
(Magnetic Memory)

A magnetic memory according to a sixth embodiment includes a plurality of spin elements. For example, the magnetic memory according to the present invention includes a plurality of SOT type magnetoresistive elements.

Figure 9:
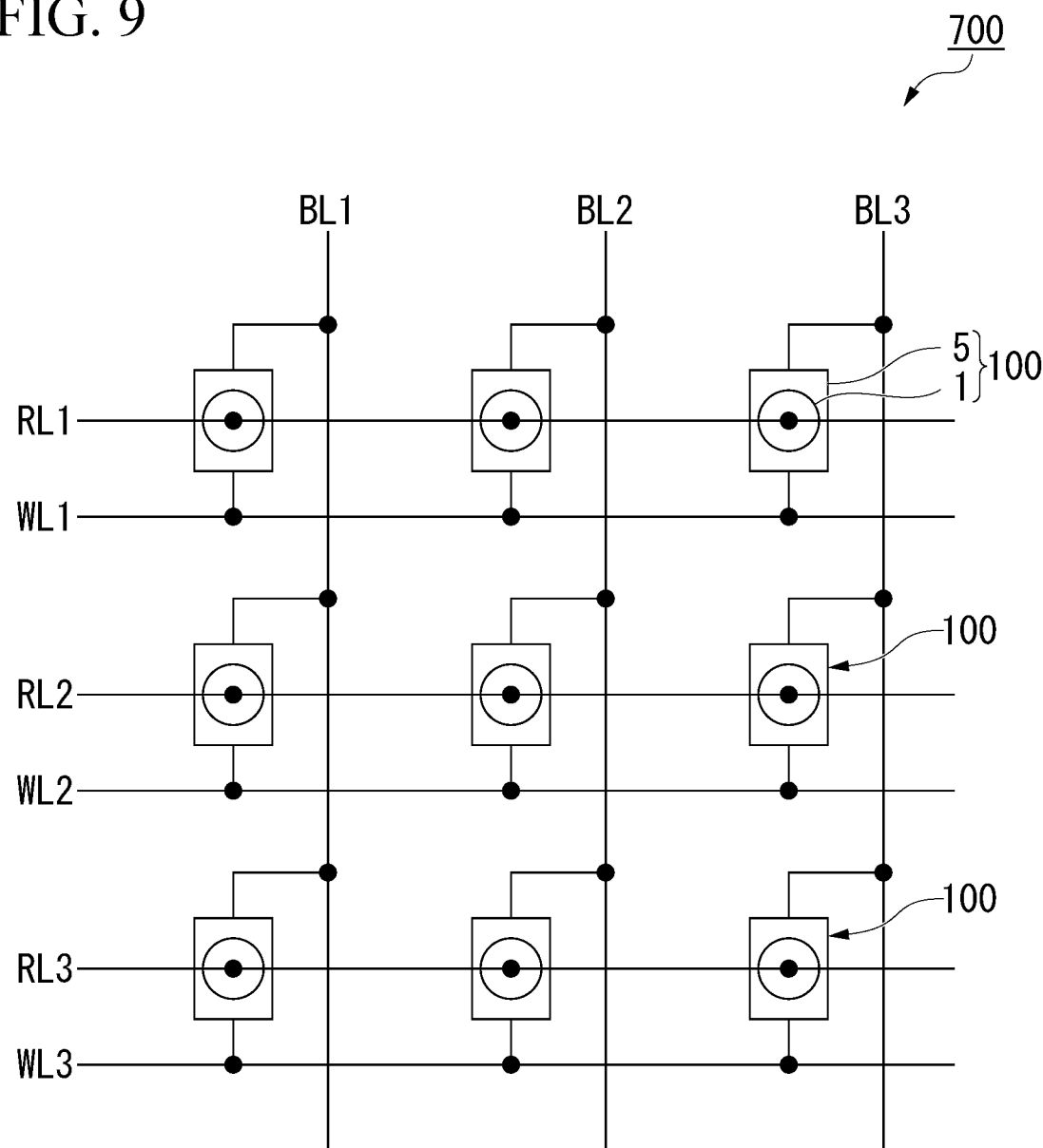
FIG. 9 is a plan view of a magnetic recording array according to a sixth embodiment.

FIG. 9 is a plan view of a magnetic recording array 700 according to the sixth embodiment. The magnetic recording array 700 shown in FIG. 9 has a 3×3 matrix arrangement of SOT type magnetization rotational elements 100. FIG. 9 shows an example of the magnetic recording array, where SOT type magnetization rotational elements 100 may be replaced with other spin elements and the number and arrangement of spin elements are arbitrary.

One word line WL 1 to WL 3, one bit line BL 1 to BL 3, and one read line RL 1 to RL 3 are connected to each SOT type magnetization rotational element 100.

By selecting a word line WL1 to WL3 and a bit line BL1 to BL3 to which to apply current, a current flows in an SOT wiring 5 of an arbitrary SOT type magnetization rotational element 100 to perform a write operation. Further, by selecting a read line RL1 to RL3 and a bit line BL1 to BL3 to which to apply current, a current flows in the lamination direction of an arbitrary SOT type magnetization rotational element 100 to perform a read operation. A word line WL1 to WL3, a bit line BL1 to BL3, and a read line RL1 to RL3 to which to apply current can be selected by transistors or the like.

Although preferred embodiments of the present invention have been described above in detail, the present invention is not limited to the specific embodiments and various modifications and changes may be made without departing from the spirit and scope of the present invention as set forth in the claims.

EXPLANATION OF REFERENCES

1 First ferromagnetic layer
2, 4 Nonmagnetic layer
3 Second ferromagnetic layer
5 SOT wiring
5' Magnetic recording layer
10, 10A, 10B Current path
11, 12, 13 Resistance adjusting portion 11A First resistance adjusting portion
11B Second resistance adjusting portion
30 Semiconductor circuit
20, 40 Structure (element portion)
100, 200, 200A, 300 SOT type magnetization rotational element
500 SOT type magnetoresistive element
600 Domain wall motion type magnetic recording element
700 Magnetic recording array

What is claimed is:

1. A spin element comprising:
an element portion including a first ferromagnetic layer;
a conducting portion that extends in a first direction as viewed in a lamination direction of the first ferromagnetic layer and faces the first ferromagnetic layer; and
a current path extending from the conducting portion to a semiconductor circuit and comprising a resistance adjusting portion between the conducting portion and the semiconductor circuit,
wherein a resistance value of the resistance adjusting portion is higher than a resistance value of the conducting portion, and
at least a part of the resistance adjusting portion is disposed outside the range of an outer shape of the conducting portion when viewed from a second direction orthogonal to the first direction.

2. The spin element according to claim 1, wherein the second direction is the lamination direction.

3. The spin element according to claim 1, wherein the second direction is orthogonal to the lamination direction and the first direction.

4. The spin element according to claim 1, wherein the resistance adjusting portion includes a plurality of resistance adjusting parts that are disposed apart from each other;
the plurality of resistance adjusting parts include a first resistance adjusting portion and a second resistance adjusting portion,
the first resistance adjusting portion is disposed in a current path between a first end of the conducting portion in the first direction and a first semiconductor circuit, and
the second resistance adjusting portion is disposed in a current path between a second end of the conducting portion in the first direction and a second semiconductor circuit.

5. The spin element according to claim 4, wherein the plurality of resistance adjusting parts all extend in the first direction, and
at least a part of the plurality of resistance adjusting parts is disposed at a depth position different from that of the conducting portion.

6. The spin element according to claim 4, wherein the resistance adjusting portion is made of a material selected from the group consisting of Ni—Cr, platinum rhodium, Chromel, Incoloy and stainless steel.

7. The spin element according to claim 1, wherein the conducting portion is a spin-orbit torque wiring configured to apply a spin orbit torque to a magnetization of the first ferromagnetic layer to rotate the magnetization of the first ferromagnetic layer, and
the element portion consist of the first ferromagnetic layer.

8. The spin element according to claim 1, wherein the conducting portion is a spin-orbit torque wiring configured to apply a spin orbit torque to a magnetization of the first ferromagnetic layer to rotate the magnetization of the first ferromagnetic layer, and
the element portion comprises the first ferromagnetic layer, a nonmagnetic layer, and a second ferromagnetic layer in order of increasing distance from the conducting portion.

9. The spin element according to claim 1, wherein the conducting portion is a magnetic recording layer having a domain wall, and
the element portion comprises a nonmagnetic layer and the first ferromagnetic layer in order of increasing distance from the magnetic recording layer.

10. A magnetic memory comprising a plurality of spin elements according to claim 1.

* * * * *